United States Patent
Corman et al.

(10) Patent No.: US 9,197,170 B2
(45) Date of Patent: Nov. 24, 2015

(54) ACTIVE LUMPED ELEMENT CIRCULATOR

(71) Applicant: ViaSat, Inc., Carlsbad, CA (US)

(72) Inventors: David W. Corman, Gilbert, AZ (US);
Glenn Diemond, Commerce, GA (US);
Donald E. Crockett, III, Mesa, AZ
(US); David W. Self, Tempe, AZ (US)

(73) Assignee: ViaSat, Inc., Carlsbad, CA (US)

( * ) Notice: Subject to any disclaimer, the term of this patent is extended or adjusted under 35 U.S.C. 154(b) by 10 days.

(21) Appl. No.: 14/201,543

(22) Filed: Mar. 7, 2014

(65) Prior Publication Data

US 2014/0266446 A1  Sep. 18, 2014

Related U.S. Application Data

(60) Provisional application No. 61/790,966, filed on Mar. 15, 2013.

(51) Int. Cl.
*H03F 3/189* (2006.01)
*H03K 17/00* (2006.01)
*H03F 3/193* (2006.01)
(Continued)

(52) U.S. Cl.
CPC ............ *H03F 3/189* (2013.01); *H03F 3/193* (2013.01); *H03H 11/02* (2013.01); *H03H 11/48* (2013.01); *H03K 17/002* (2013.01); *H01P 1/36* (2013.01);
(Continued)

(58) Field of Classification Search
CPC ............ H01P 1/36; H01P 1/38; H01P 1/387; H03H 11/02; H03H 11/48; H03F 3/193; Y10T 29/41

USPC ................ 333/1, 1.1, 24.2; 330/260
See application file for complete search history.

(56) References Cited

U.S. PATENT DOCUMENTS 6,731,173 B1 *  5/2004  Thompson .................... 330/296
8,120,424 B2   2/2012  Luff
(Continued)

FOREIGN PATENT DOCUMENTS

GB        1227812       4/1971
WO   WO-2014/150502 A1  9/2014

OTHER PUBLICATIONS

Atiya, "An Operational Amplifier Circulator Based on the Weighted Summer," IEEE Transactions on Circuits and Systems, Jun. 1975, pp. 516-523, vol. CAS-22, No. 6.
(Continued)

*Primary Examiner* — Benny Lee
*Assistant Examiner* — Albens Dieujuste
(74) *Attorney, Agent, or Firm* — Snell & Wilmer L.L.P.

(57) ABSTRACT

An integrated circuit can comprise: a first port, a second port, and a third port; and a plurality of microwave operational amplifiers coupled to each other and the first port, the second port, and the third port. The plurality of microwave operational amplifiers can be arranged to substantially pass a signal provided to the first port to the second port while substantially isolating the signal provided to the first port from the third port; the plurality of microwave operational amplifiers can be arranged to substantially pass a signal provided to the second port to the third port while substantially isolating the signal provided to the second port from the first port; and the plurality of microwave operational amplifiers can be arranged to substantially pass a signal provided to the third port to the first port while substantially isolating the signal provided to the third port from the second port.

16 Claims, 7 Drawing Sheets

(51) Int. Cl.
  *H03H 11/02* (2006.01)
  *H03H 11/48* (2006.01)
  *H03H 3/00* (2006.01)
  *H01P 1/38* (2006.01)
  *H01P 1/36* (2006.01)

(52) U.S. Cl.
  CPC .. *H01P 1/38* (2013.01); *H03H 3/00* (2013.01); *Y10T 29/41* (2013.01)

(56) References Cited

U.S. PATENT DOCUMENTS

2011/0164299 A1* 7/2011 Morton et al. ............... 359/238
2014/0266399 A1   9/2014 Corman et al.

OTHER PUBLICATIONS

Chen et al., "Design of Active Circulators Using High-Speed Operational Amplifiers," IEEE Microwave and Wireless Components Letters, Oct. 2010, pp. 575-577, vol. 20, No. 10.

WIPO, International Search Report and Written Opinion mailed Jun. 26, 2014 in counterpart International Application No. PCT/US2014/023434.

International Preliminary Report on Patentability mailed in International (PCT) Application No. PCT/US2014/023434 on Sep. 24, 2015, 8 pgs.

Non-Final Office Action mailed in U.S. Appl. No. 14/201,552 on Oct. 5, 2015, 14 pgs.

* cited by examiner

ACTIVE LUMPED ELEMENT CIRCULATOR

CROSS REFERENCE TO RELATED APPLICATIONS

This application is a non-provisional of U.S. Provisional Application No. 61/790,966, entitled "ACTIVE LUMPED ELEMENT CIRCULATOR/ISOLATOR," which was filed on Mar. 15, 2013. All of the contents of the previously-identified application are hereby incorporated by reference for any purpose in their entirety.

BACKGROUND

Various non-reciprocal devices, such as circulators and isolators are helpful devices in radio frequency (RF) electronics systems. RF circulators and isolators typically comprise magnetized ferrite materials. Unfortunately, conventional ferrite-based devices tend to be expensive, narrow-band, and bulky. Integration of such devices (e.g., onto a monolithic substrate) is also impractical or impossible. Moreover, discrete component, non-ferrite solutions do not tend to work well at higher frequencies.

SUMMARY

In an example embodiment, an integrated circuit can comprise: a first port, a second port, and a third port; and a plurality of microwave operational amplifiers coupled to each other and the first port, the second port, and the third port. In this example embodiment, the plurality of microwave operational amplifiers can be arranged to substantially pass a signal provided to the first port to the second port while substantially isolating the signal provided to the first port from the third port; the plurality of microwave operational amplifiers can be arranged to substantially pass a signal provided to the second port to the third port while substantially isolating the signal provided to the second port from the first port; and the plurality of microwave operational amplifiers can be arranged to substantially pass a signal provided to the third port to the first port while substantially isolating the signal provided to the third port from the second port.

In another example embodiment, an active integrated circuit circulator can comprise: a semiconductor substrate having an active circulator formed thereon, wherein the active circulator can be a lumped element active device. In this example embodiment, the active circulator can comprise: at least three ports; and at least three microwave operational amplifiers. In this example embodiment, the at least three ports can be arranged logically in a circle, and each port of the at least three ports can be coupled to a respective one of the at least three microwave operational amplifiers, and the at least three microwave operational amplifiers can each be configured to substantially pass a signal provided to each one of the at least three ports to the next of the at least three ports while substantially isolating the signal provided to each one of the at least three ports from all other ports.

In an example embodiment, a method of making an integrated circuit can comprise: providing a semiconductor substrate; and forming thereon an active circulator as a lumped element device. In this example embodiment, forming an active circulator can further comprise: forming a first port, a second port and a third port; and forming a plurality of microwave operational amplifiers coupled to each other and to the first port, the second port and the third port. The method, in an example embodiment, can further comprise forming a transceiver, having a transmit portion and a receive portion, on the semiconductor substrate, wherein the semiconductor substrate can be a monolithic semiconductor substrate. In this embodiment, the active circulator can further be configured as one of: an active isolator, an active duplexer, an active diplexer, and an active reflection amplifier.

BRIEF DESCRIPTION OF THE DRAWING FIGURES

A more complete understanding of this disclosure may be derived by referring to the detailed description and claims when considered in connection with the drawing figures, wherein like reference numbers refer to similar elements throughout the drawing figures, and:

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In accordance with an example embodiment, an integrated circuit can comprise a first port, a second port, a third port, and a plurality of microwave operational amplifiers. The operational amplifiers can be coupled to each other and to the first port, second port, and third port. The integrated circuit can be configured such that a signal applied to one port can be provided to the next port and blocked from the subsequent port. For example, the integrated circuit can be configured such that a signal applied to the first port can be passed to the second port, a signal applied to the second port can be passed to the third port, and a signal applied to the third port can be passed to the first port.

Although described herein, at times, in terms of a signal from one port being passed to or blocked from another identified port, this is only for convenience in description. The description herein of a signal being passed from a first port to a second port, can encompass where an input signal at the first port substantially passes (i.e., with some desired maximum amount of attenuation) to the second port. Similarly, the description of a signal from a first port being blocked from a third port, can encompass where the signal from the first port can be substantially isolated (i.e., with some minimum amount of attenuation) from the third port. Thus, throughout, and where appropriate, the term "passed" and its synonyms can be interpreted as "substantially passed," and the term "blocked" and its synonyms (e.g., "isolating") can be interpreted as "substantially blocked" or "substantially isolating."

Stated another way, the active device can be configured to provide a minimum loss in the signal passed from one port to another, and to provide a maximum of isolation for that signal with respect to yet another port. For example, one example active circulator can be configured to pass a signal from one port to another with less than 0.5 dB loss, or less than 1 dB loss. In another example embodiment, an active circulator can be configured to pass a signal from one port to another passing at least 90% of the signal with only about 10% attenuation. Moreover, the attenuation can be configured to a be suitable level of attenuation. Similarly, in an example embodiment, an active circulator can be configured to block about 99% of the signal, have approximately 20 dB attenuation, or other suitable attenuation so as to substantially block the signal to the other port.

In an example embodiment, the integrated circuit can be an active circulator (active integrated circuit circulator) implemented on an integrated circuit. An active circulator, in an example embodiment, can comprise active components, such as operational amplifiers. In one example embodiment, the active circulator can be configured to have no discrete components. In another example embodiment, the active circulator can be configured to comprise at least some non-passive devices. The active circulator can be formed of power consuming components. In an example embodiment, the active circulator can be a solid state active circulator. Moreover, the active circulator can be formed with non-ferrite components. Nevertheless, the active circulator can be configured to emulate a ferrite circulator. In an example embodiment, the active circulator can be a non-reciprocal device.

Figure 1:
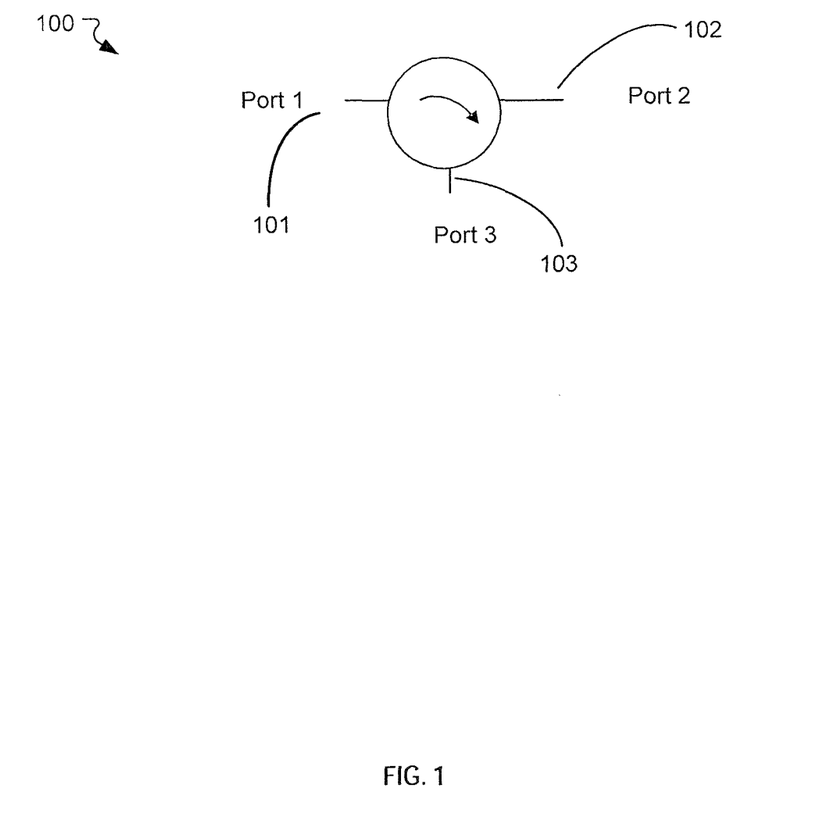
FIG. 1 is a block diagram of an example circulator.

FIG. 1, illustrates a block diagram of a circulator 100. In an example embodiment, an input signal to port 1 (101) substantially passes (i.e., with some desired maximum amount of attenuation) to port 2 (102), while being substantially isolated (i.e., with some minimum amount of attenuation) to port 3 (103). Similarly, a signal provided to port 2 (102) substantially passes to port 3 (103) while being substantially isolated from port 1 (101); and, a signal provided to port 3 (103) substantially passes to port 1 (101) while being substantially isolated from port 2 (102).

In this example embodiment, the ports 101-103 can be arranged, logically, in a circle. By this, it is meant that there can be, for example a first port, a second port, and a third port, wherein the signal from one port is substantially passed to the next port and blocked from the other port (including from the input port). In an embodiment with three ports, the second port can be the "next" port to the first port, the third port can be the "next" port to the second port, and the first port can be the "next" port to the third port. In an embodiment with four ports, the first port can be the "next" port to the fourth port. And in general, the first port can be the "next" port to the last port. Thus, the ports can be considered in a logical circle, and the microwave operational amplifiers configured to substantially pass a signal provided to each one of the at least three ports to the next of the at least three ports while substantially isolating the signal provided to each one of the at least three ports from all other ports.

In an example embodiment, circulator 100 can be an active circulator. The active circulator can, in an example embodiment, comprise a lumped element active circulator (lumped element active device or lumped element integrated circuit active circulator). By "lumped element," it is intended to convey that the active circulator circuitry can be small enough in size to avoid introducing phase lengths causing parasitics and performance degradation. For example, the lumped element active circulator can be less than five to 10 degrees phase length in terms of the distance across the circuitry. In another example, the lumped element active circulator can be less than $\frac{1}{20}^{th}$ of a wavelength or less than 5% of a wavelength in terms of the distance across the circuitry. Moreover, the lumped element active circulator can be dimensioned as appropriate for avoiding substantial performance reduction.

In an example embodiment, the active circulator can comprise more than three ports. For example, the active circulator can comprise four ports. In another example, the active circulator comprises at least three ports and at least three microwave operational amplifiers. Moreover, the active circulator can comprise a suitable number of ports greater than two ports.

Figure 2:
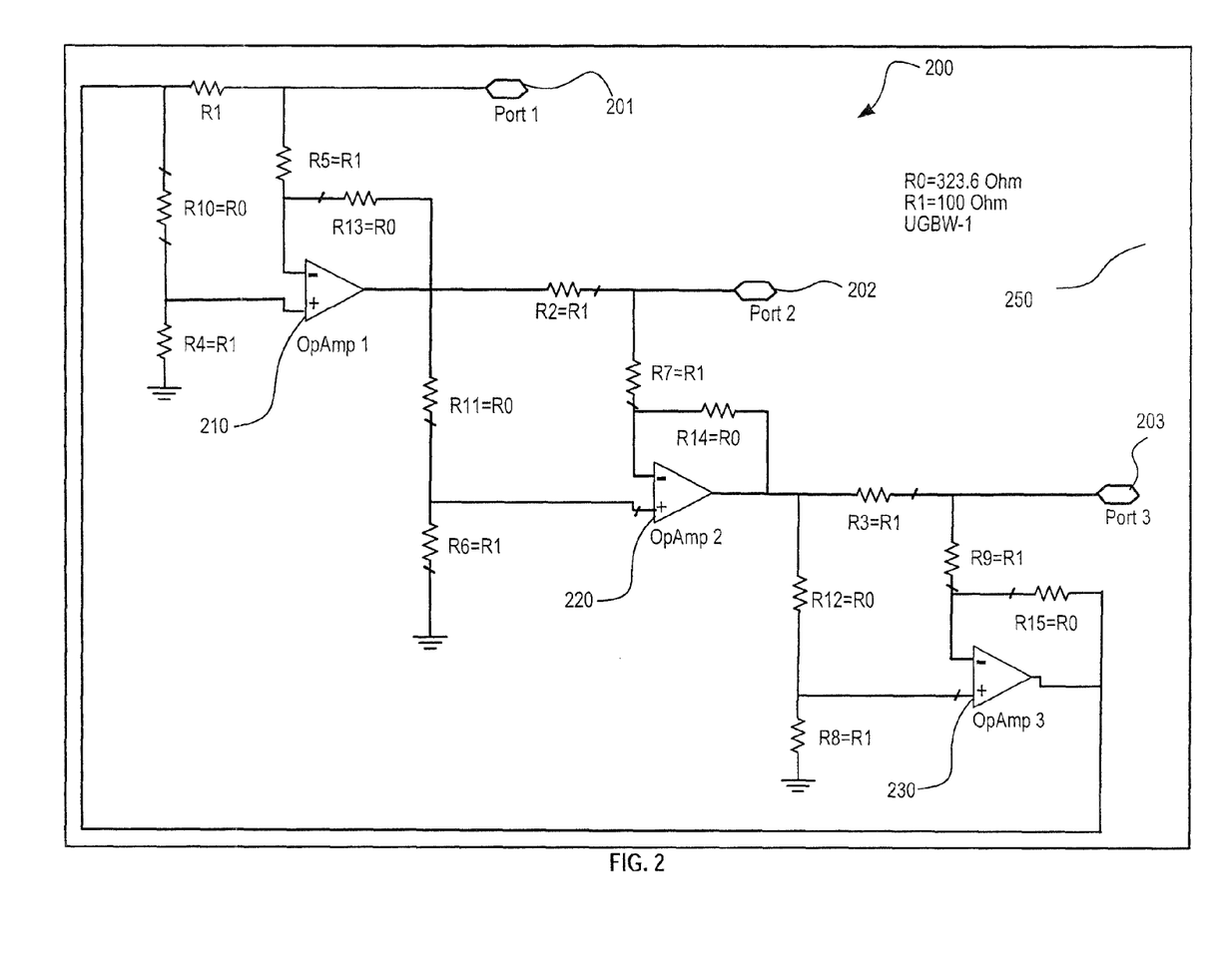
FIG. 2 is a schematic diagram of an integrated circuit implemented lumped element active circulator in accordance with an example embodiment.

In one example embodiment, and with reference to the schematic drawing in FIG. 2, an active circulator 200 can be formed on an integrated circuit 250. Active circulator 200 can comprise a first port 201, second port 202, and third port 203. Active circulator 200 can further comprise a first operational amplifier 210, second operational amplifier 220, and third operational amplifier 230. The operational amplifier (210, 220, 230) can be formed using various semiconductor processes. For example, in some embodiments, the operational amplifier may be implemented in silicon germanium (SiGe). In other example embodiments, the operational amplifier may be implemented on a suitable semiconductor substrate (e.g., SiGe, Gallium Arsenide, Complementary Metal Oxide Semiconductor (CMOS), etc.). Moreover, in one example embodiment, the entire circuit of active circulator 200 can be implemented on a single semiconductor substrate.

In various example embodiments, active circulator 200 can be configured with an arrangement of resistors in a voltage divider implementation. The resistors can be connected to the operational amplifiers such that a signal applied to an Nth port (e.g., in a three port system, where N=1 to 3, and where N>3 wraps back around starting at N=1) can be passed via an Nth operational amplifier to an N+1 port, but not to the N+2 port. This can be done, for example, by a resistor configuration that makes the signal from the Nth operational amplifier cancel itself out as an input to the N+1th operational amplifier. However, the input to the N+1 port may not be canceled out by the N+1th operational amplifier. Moreover, signals from an N+1 port can be shielded from the Nth port by the high output impedance of the Nth operational amplifier. Although one example active circulator has been set forth in detail here, other suitable active circulators implementations can be used as appropriate to achieve the circulator functionality described herein.

In some embodiments, the microwave operational amplifiers may have a unity gain bandwidth (UGBW) greater than two to three times a frequency of operation for the device. In an example embodiment, the operating frequency can be approximately the frequency of the signals input/output to/from the ports of the active circulator. In an example embodiment, the operating frequency can be a range of frequencies. In the event that a range of frequencies are used with the active circulator or that a different frequency is applied to one port versus another, the highest frequency can be used for purposes of determining this relationship between the unity gain bandwidth and the operation frequency of the active circulator.

In one example embodiment, the active circulator comprises microwave operational amplifiers having a unity gain bandwidth of about 20 to 25 GHz that can provide for circulator operation at operational frequencies of about 7 to 8 GHz. In various example embodiments, the operating frequency can be an X band frequency, a Ku band frequency, a Ka band frequency, a frequency range centered about 24 GHz or 77 GHz, and/or other suitable frequencies or frequency ranges. Thus, for example, the UGBW for operational amplifiers in an active circulator having a 24 GHz operating frequency can be 48 GHz or higher. In general, the microwave operation amplifier may have a unity gain bandwidth of about two to three times the desired frequency of operation of the active circulator.

Figure 3:
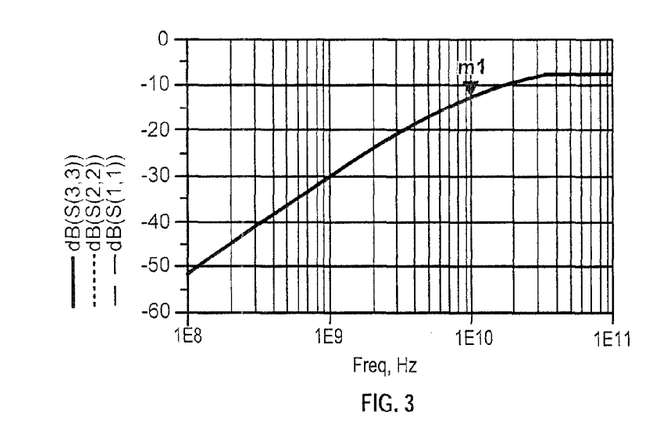
FIGS. 3-8 are example S-parameter graphs for an example ideal active circulator.
Figure 4:
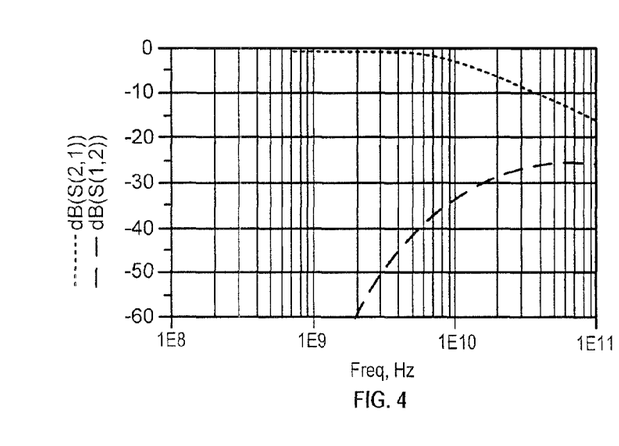
Figure 5:
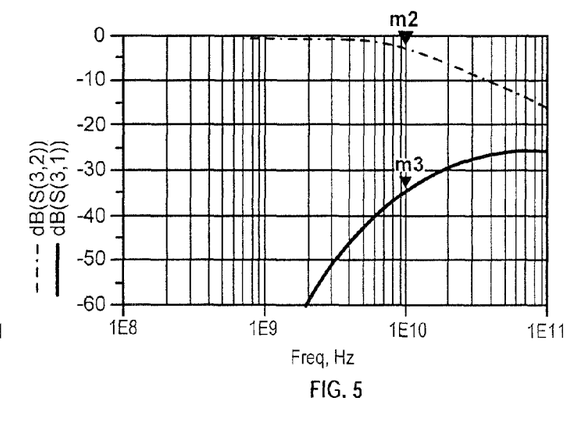

FIGS. 3-8 illustrate simulation results of a circulator/isolator using a theoretically ideal operational amplifier. For simulation purposes, the parameters of the operational amplifier were as follows:

Gain=100 dB
Rout–100 Ohm
Rdiff=1 MOhm
CDiff=0 F
RCom=1 MOhm
CCom=0 F
SlewRate=1e+6
IOS=0A
VOS=0V
VEE=–15V
VCC=15V FIGS. 3-5 show simulated performance (in S parameters) as a function of operating frequency when the unity gain bandwidth (UGBW) of the operational amplifier is assumed to be 100 GHz (and the DC gain is assumed to be 100 dB). As can be seen, depending on the desired attenuation and isolation, suitable performance of the simulated device may be obtained at operating frequencies on the order of 10 GHz.

Figure 6:
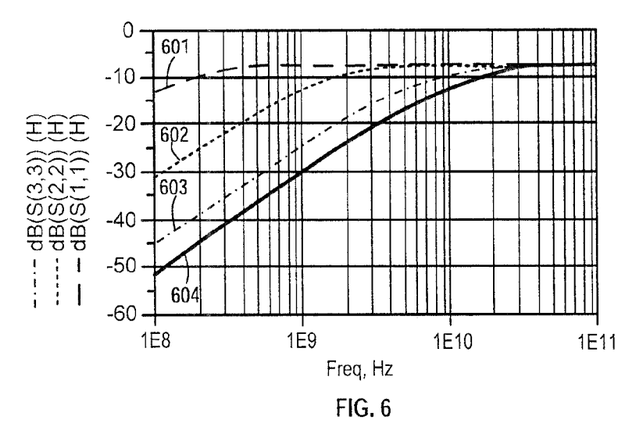
Figure 7:
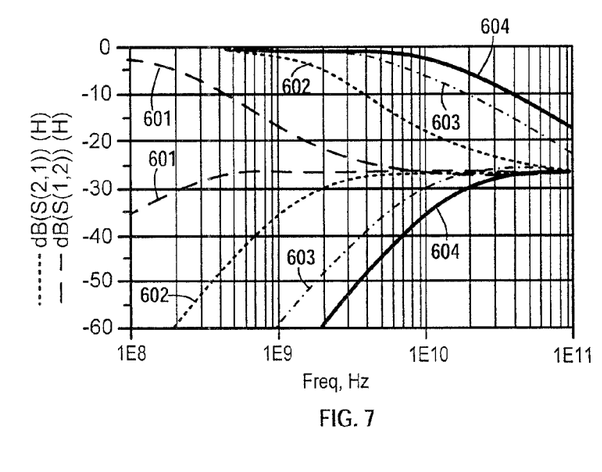
Figure 8:
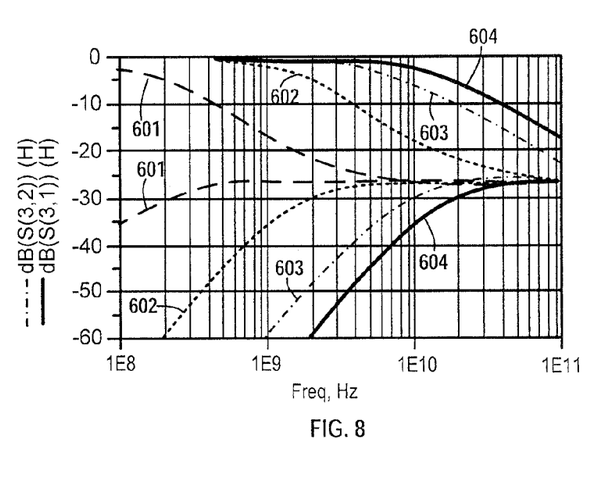

FIGS. 6-8 show simulated performance when the UGBW is varied over a range of frequencies from 100 MHz to 100 GHz to illustrate the performance of the resulting active circulator. FIG. 6 illustrates the input return loss for various unity gain bandwidths over a wide frequency range. FIGS. 7 and 8, respectively, illustrate the signal loss (for one port) and signal isolation (for the other port) of the active circulator. As the UGBW becomes smaller, the useful frequency range of the active circulator can be reduced. Useful performance can be provided over a substantial portion of the UGBW of the operational amplifiers. More particularly, depending on the desired level of isolation and attenuation, operation at frequencies of about ⅕, ¼, ⅓, or any other suitable fraction or percentage of the UGBW of the operational amplifier can be provided.

Figure 9:
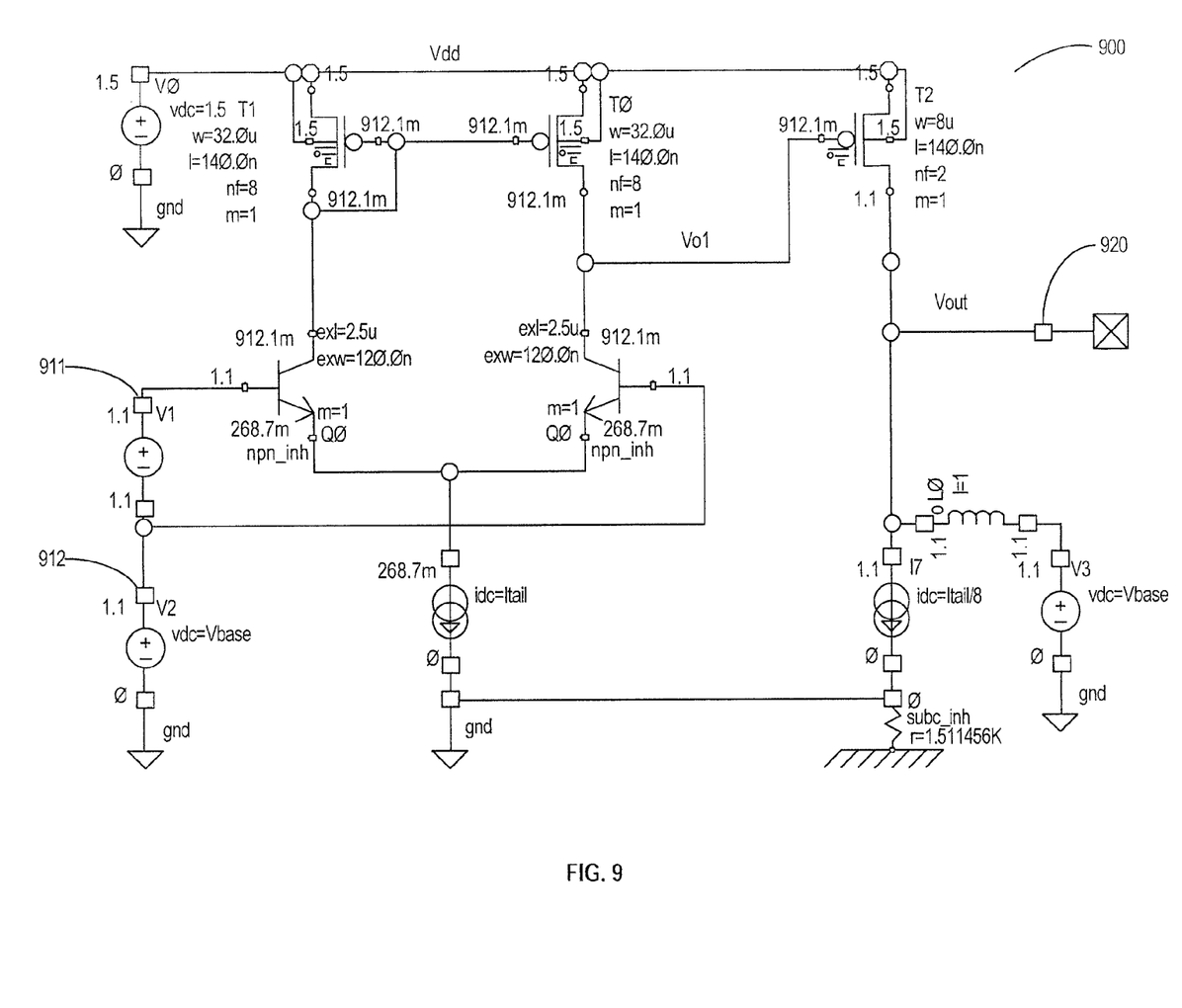
FIG. 9 is a circuit diagram showing an example unity gain bandwidth operational amplifier.

FIG. 9 illustrates a schematic of one example implementation of a microwave operational amplifier suitable for fabrication in silicon germanium. An operational amplifier 900 can comprise a first input 911, a second input 912, and an operational amplifier output 920. Such an amplifier may be capable of UGBW on the order of 20 to 25 GHz. Simulation of the resulting circuit shows an open loop gain of 56.7 dB, and a unity gain bandwidth of 21.65 GHz. Other suitable implementations of a microwave operational amplifier can also be used in a practical active circulator.

The active circulator can be useful in various applications and may be implemented in different ways depending on the application. In one example embodiment, the active circulator can comprise one of: an active isolator, active diplexer, active duplexer, active reflection amplifier, and the like. Moreover, all references to an "active circulator" herein, can be considered to apply to an active isolator, active diplexer, active duplexer, active reflection amplifier, when appropriate. In various example embodiments, the active circulator can be used in conjunction with an antenna. The antenna can be a phased array antenna, a feed horn type antenna, or other antenna.

In an example embodiment, the active circulator can comprise an active isolator. For example, the isolator can comprise a three-port circulator with one port terminated in a matched load. In such a case, an isolator can serve to primarily only allow signals to pass in one direction through the isolator. In this respect, an isolator may be configured to shield equipment on an input side of the isolator from effects of conditions on an output side of the isolator.

In another example embodiment, the active circulator can be configured as an active duplexer or active diplexer. In an example embodiment, the term a duplexer can be more appropriate where a single frequency is used for bi-directional (duplex) communication over a single path. The term diplexer may be more appropriate where two different frequencies may be communicated over a single path. In either case, the active duplexer/diplexer can be configured to isolate a first port from a third port, where both ports are in communication with a common second port (bi-directional second port). For example, in radar and radio communications systems, the duplexer/diplexer can be configured to isolate a receiver from a transmitter while permitting them to share a common antenna.

In one example embodiment, a radio repeater system can comprise an active duplexer. In another example embodiment a radar system can comprise an active duplexer. In this embodiment, signals from the transmitter (or transmit portion of a transceiver) can be routed to the antenna and signals from the antenna can be routed to the receiver without allowing these signals to pass directly from the transmitter to the receiver. For example, a radar transmit signal can be injected at a first port and passed to the second port attached to the antenna. The antenna can transmit the radar transmit signal. Radar receive signals received back at the antenna can be passed back to the second port, and can be passed from the second port to the third port. The third port can be connected to the receiver (or receive portion of a transceiver).

In another example embodiment, the active circulator can be used as an active reflection amplifier.

More generally, the individual ports of the active circulator can be connected, ultimately, to suitable RF devices, transmitters, receivers, transceivers, components, antennas, circuits, and the like. In some example embodiments, one or more of these can be located off of the integrated circuit upon which the active circulator exists. In various other example embodiments, one or more of these RF devices, transmitters, receivers, transceivers, components, antennas, circuits, and the like, can be located on the integrated circuit with the active circulator. Moreover, an antenna, receiver, transmitter, components, circuits, devices or the like can be connected to an individual port of the active circulator. For example, a transmitter can be connected to a first port of the active circulator, an antenna can be connected to the second port, and a receiver can be connected to the third port.

Figure 10:
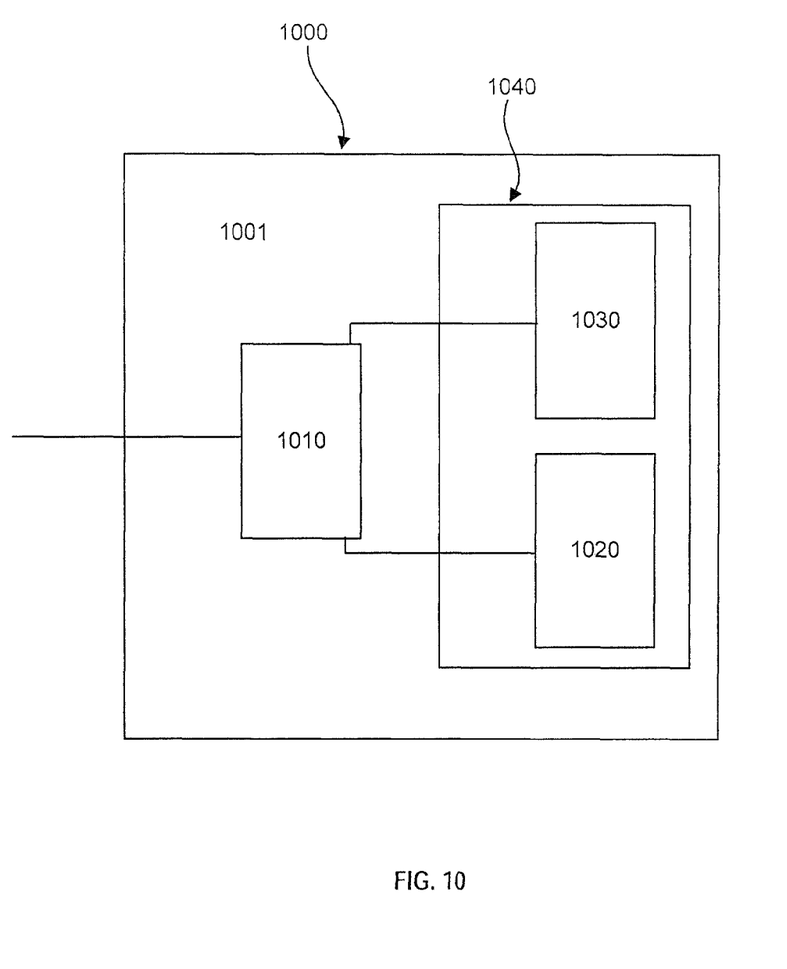
FIG. 10 is a block diagram of an example integrated circuit comprising a lumped element active circulator and additional components.

With reference now to FIG. 10, in an example embodiment, an integrated circuit 1000 can comprise a substrate 1001. The substrate can comprise an active circulator 1010 formed on substrate 1001. The substrate can further comprise a transceiver 1040. Transceiver 1040 can further comprise a receiver portion 1030 and a transmitter portion 1020. In an example embodiment, a first port of active circulator 1010 can be configured in signal communication with transmitter portion 1020 via a transmit path. A second port of active circulator 1010 can be configured in signal communication with an antenna (or the like). A third port of active circulator 1010 can be configured in signal communication with a receiver portion 1030 via a receive path. In an example embodiment, the active circulator can be configured to facilitate full duplex transmit and receive communication between the transceiver 1040 (comprising the transmitter portion 1020 and receiver portion 1030) and the antenna. In this example, a signal can be provided by a transmitter (or from a transmit portion 1020 of a transceiver 1040) to the first port via the transmit path, and communicated to the antenna via the second port. At the same time, a signal received at the antenna (for example from a satellite) can be provided to the second port and communicated to the third port. This received signal can be communicated from the third port to a receiver (or to a receive portion 1030 of the transceiver 1040). In this manner, an integrated circuit can comprise a monolithic device (monolithic semiconductor substrate) with both an active circulator and one or more other circuits, transmitters, receivers, electrical components, and the like combined on the single substrate.

Moreover, the connection of the active circulator ports to such devices and the like can be a direct connection or an indirect connection via an intermediary pathway. For example, the ports can be connected to a waveguide, a transmission line, a microstrip, and/or other suitable structures for conveying RF signals.

Figure 11:
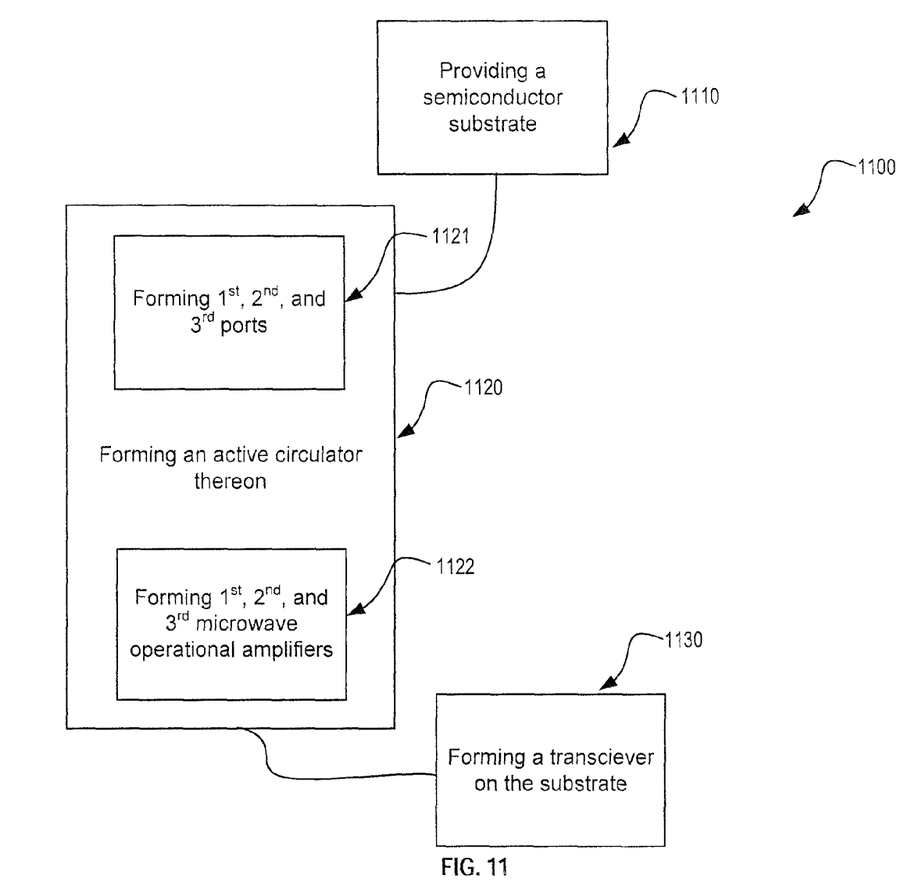
FIG. 11 is a block diagram of an example method of making an integrated circuit by forming an active circulator thereon.

With reference now to FIG. 11, in an example embodiment, a method 1100 of making an integrated circuit can comprise: providing a semiconductor substrate 1110; and forming thereon an active circulator as a lumped element device 1120. In this example embodiment, forming an active circulator 1120 can further comprise: forming a first port, a second port and a third port 1121; and forming a plurality of microwave operational amplifiers coupled to each other and to the first port, the second port and the third port 1122. The plurality of microwave operational amplifiers can be arranged, for example, to substantially pass a signal provided to the first port to the second port while substantially isolating the signal provided to the first port from the third port. The plurality of microwave operational amplifiers can be arranged, for example, to substantially pass a signal provided to the second port to the third port while substantially isolating the signal provided to the second port from the first port. Furthermore, the plurality of microwave operational amplifiers can be arranged, for example, to substantially pass a signal provided to the third port to the first port while substantially isolating the signal provided to the third port from the second port.

The method, in an example embodiment, can further comprise forming a transceiver, having a transmit portion and a receive portion, on the semiconductor substrate 1130. In an example embodiment, the semiconductor substrate can be a monolithic semiconductor substrate. In this embodiment, the active circulator can further be configured as one of: an active isolator, an active duplexer, an active diplexer, and an active reflection amplifier.

While several illustrative applications have been described, many other applications of the presently disclosed techniques may prove useful. Accordingly, the above-referenced arrangements are illustrative of some applications for the principles of the present invention. It will be apparent to those of ordinary skill in the art that numerous modifications can be made without departing from the principles and concepts disclosed herein.

In describing the present invention, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also to include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

We claim:

1. An integrated circuit comprising:
   a first port, a second port, and a third port; and
   a plurality of microwave operational amplifiers coupled to each other and the first port, the second port, and the third port;
   wherein the plurality of microwave operational amplifiers are arranged to substantially pass a first signal provided to the first port to the second port while substantially isolating the first signal provided to the first port from the third port;

wherein the plurality of microwave operational amplifiers are arranged to substantially pass a second signal provided to the second port to the third port while substantially isolating the second signal provided to the second port from the first port;

wherein the plurality of microwave operational amplifiers are arranged to substantially pass a third signal provided to the third port to the first port while substantially isolating the third signal provided to the third port from the second port; and wherein the plurality of microwave operational amplifiers each provide a unity gain bandwidth of at least three times a frequency of the first signal provided to the first port.

2. The integrated circuit of claim 1, wherein the integrated circuit comprises an active isolator.

3. The integrated circuit of claim 1, wherein the plurality of microwave operational amplifiers each provide a unity gain bandwidth of at least 10 GHz.

4. The integrated circuit of claim 1, wherein the plurality of microwave operational amplifiers are implemented on a monolithic semiconductor substrate.

5. The integrated circuit of claim 1, wherein the plurality of microwave operational amplifiers are implemented in silicon germanium.

6. The integrated circuit of claim 1, wherein the integrated circuit comprises a non-reciprocal device.

7. The integrated circuit of claim 1, wherein the integrated circuit comprises an active circulator.

8. The integrated circuit of claim 7, wherein the active circulator is a lumped element integrated circuit active circulator.

9. An integrated circuit comprising:
a semiconductor substrate;
a non-reciprocal device comprising one of an active circulator and an active isolator, wherein the non-reciprocal device is integrated on the semiconductor substrate;
wherein the non-reciprocal device is a lumped element active device, and wherein the non-reciprocal device comprises:
a first port, a second port, and a third port; and
a first microwave operational amplifier, a second microwave operational amplifier, and a third microwave operational amplifier;
wherein the non-reciprocal device is configured to substantially pass a first signal provided to the first port to the second port while substantially isolating the first signal provided to the first port from the third port;
wherein the non-reciprocal device is configured to substantially pass a second signal provided to the second port to the third port while substantially isolating the second signal provided to the second port from the first port;
wherein the non-reciprocal device is configured to substantially pass a third signal provided to the third port to the first port while substantially isolating the third signal provided to the third port from the second port; and
wherein the first, second, and third microwave operational amplifiers each provide a unity gain bandwidth of at least 10 GHz.

10. The integrated circuit of claim 9, wherein the first, second, and third microwave operational amplifiers each provide a unity gain bandwidth of at least three times a frequency of the first signal provided to the first port.

11. The integrated circuit of claim 9, wherein the first port is coupled to an input of the first microwave operational amplifier, wherein the second port is coupled to an input of the second microwave operational amplifier, and wherein the third port is coupled to an input of the third microwave operational amplifier.

12. The integrated circuit of claim 9, wherein the non-reciprocal device is a non-ferrite based active circulator.

13. A radio frequency (RF) electronics system comprising:
a phased array antenna; and
a non-reciprocal device comprising one of an active circulator and an active isolator, wherein the active circulator is a lumped element active circulator and wherein the active isolator is a lumped element active isolator;
wherein the non-reciprocal device is integrated on a monolithic semiconductor substrate and comprises:
a plurality of microwave operational amplifiers; and
a first port, a second port, and a third port, wherein the plurality of microwave operational amplifiers each provide a unity gain bandwidth of at least three times the highest operating frequency of the individual signals provided to one of the first port, the second port and the third port.

14. The RF electronics system of claim 13, wherein the plurality of microwave operational amplifiers each provide a unity gain bandwidth of at least 10 GHz.

15. The RF electronics system of claim 13, wherein the plurality of microwave operational amplifiers are implemented in silicon germanium.

16. The RF electronics system of claim 13,
wherein the non-reciprocal device is configured to substantially pass a first signal provided to the first port to the second port while substantially isolating the first signal provided to the first port from the third port;
wherein the non-reciprocal device is configured to substantially pass a second signal provided to the second port to the third port while substantially isolating the second signal provided to the second port from the first port; and
wherein the non-reciprocal device is configured to substantially pass a third signal provided to the third port to the first port while substantially isolating the third signal provided to the third port from the second port.

* * * * *